United States Patent
Chung et al.

(10) Patent No.: US 10,068,712 B2
(45) Date of Patent: Sep. 4, 2018

(54) GLASS MATERIAL FOR SEALING LARGE-AREA DYE-SENSITIZED SOLAR CELL

(71) Applicant: Orion Co., Ltd., Gyeongsangbuk-do (KR)

(72) Inventors: Woon-Jin Chung, Chungcheongnam-do (KR); Han-Sol Lee, Daejeon (KR); Jae-Kwun Cho, Gyeongsangbuk-do (KR); Jae-Kwun Hwang, Gyeongsangbuk-do (KR)

(73) Assignee: Orion Co., Ltd., Gumi (KR)

( * ) Notice: Subject to any disclaimer, the term of this patent is extended or adjusted under 35 U.S.C. 154(b) by 0 days.

(21) Appl. No.: 15/312,142

(22) PCT Filed: May 20, 2015

(86) PCT No.: PCT/KR2015/005044
§ 371 (c)(1),
(2) Date: Nov. 17, 2016

(87) PCT Pub. No.: WO2015/178678
PCT Pub. Date: Nov. 26, 2015

(65) Prior Publication Data
US 2017/0092437 A1    Mar. 30, 2017

(30) Foreign Application Priority Data
May 21, 2014   (KR) .................. 10-2014-0060928

(51) Int. Cl.
*C03C 3/21*        (2006.01)
*C03C 8/08*        (2006.01)
(Continued)

(52) U.S. Cl.
CPC ............ *H01G 9/2077* (2013.01); *C03C 3/21* (2013.01); *C03C 8/08* (2013.01); *C03C 8/24* (2013.01);
(Continued)

(58) Field of Classification Search
CPC .... C03C 8/24; C03C 3/21; C03C 8/04; C03C 8/08
See application file for complete search history.

(56) References Cited

U.S. PATENT DOCUMENTS 7,863,207 B2 *   1/2011   Son .......................... C03C 8/04
                                                              156/275.5
9,048,056 B2 *   6/2015   Yoshimura ................ C03C 3/21
(Continued)

FOREIGN PATENT DOCUMENTS

JP    2006342044    * 12/2006
JP    2011086518    *  4/2011
(Continued)

*Primary Examiner* — Karl E Group
(74) *Attorney, Agent, or Firm* — Seed IP Law Group LLP

(57) ABSTRACT

The present invention relates to a glass material for sealing a large-area dye-sensitized solar cell and, more specifically, to a glass material which does not react with an electrolyte and allows uniform and high-strength binding even on a large area. According to the present invention, the glass material is expected to produce action effects of improving reliability and lifetime of solar cell products since it can uniformly seal a dye-sensitized solar cell, is chemically stable due to the absence of the reaction with an electrolyte, and has physical strength appropriate for large-area binding.

6 Claims, 3 Drawing Sheets

(51) Int. Cl.
*C03C 8/24* (2006.01)
*H01G 9/20* (2006.01)
*H01L 31/04* (2014.01)

(52) U.S. Cl.
CPC .......... *H01L 31/04* (2013.01); *C03C 2205/00* (2013.01); *H05K 999/99* (2013.01); *Y02E 10/542* (2013.01)

(56) References Cited

U.S. PATENT DOCUMENTS

2009/0069164 A1* 3/2009 Lamberson ............. C03C 1/026
 501/15
2009/0136766 A1 5/2009 Son et al.
2012/0063076 A1* 3/2012 Yoshimura ................ C03C 3/21
 361/679.01

FOREIGN PATENT DOCUMENTS

| KR | 10-2009-0054189 A | 5/2009 |
| KR | 10-2009-0100649 A | 9/2009 |
| KR | 10-2011-0053580 A | 5/2011 |
| KR | 10-1255779 B1 | 4/2013 |

* cited by examiner

[Fig. 1]
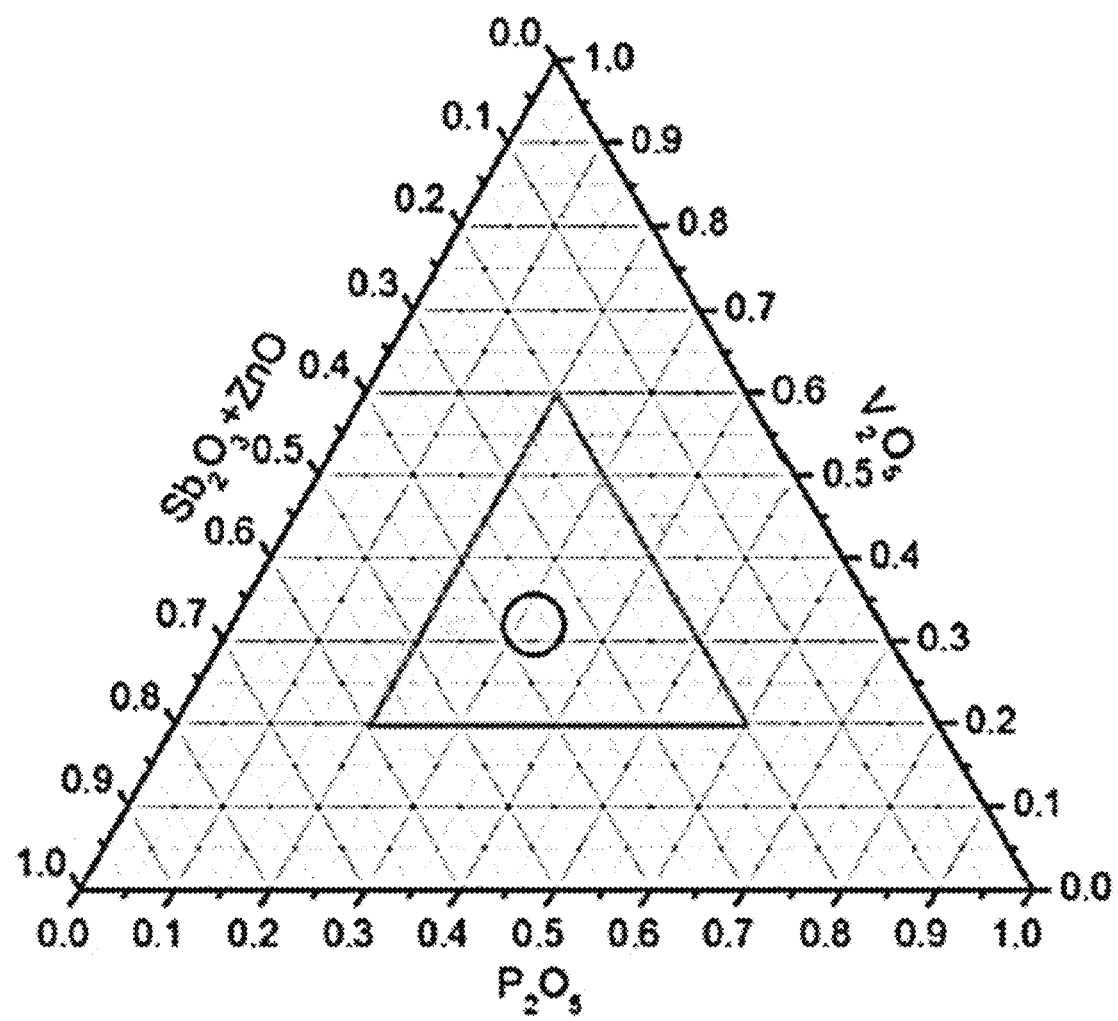

[Fig. 2A]
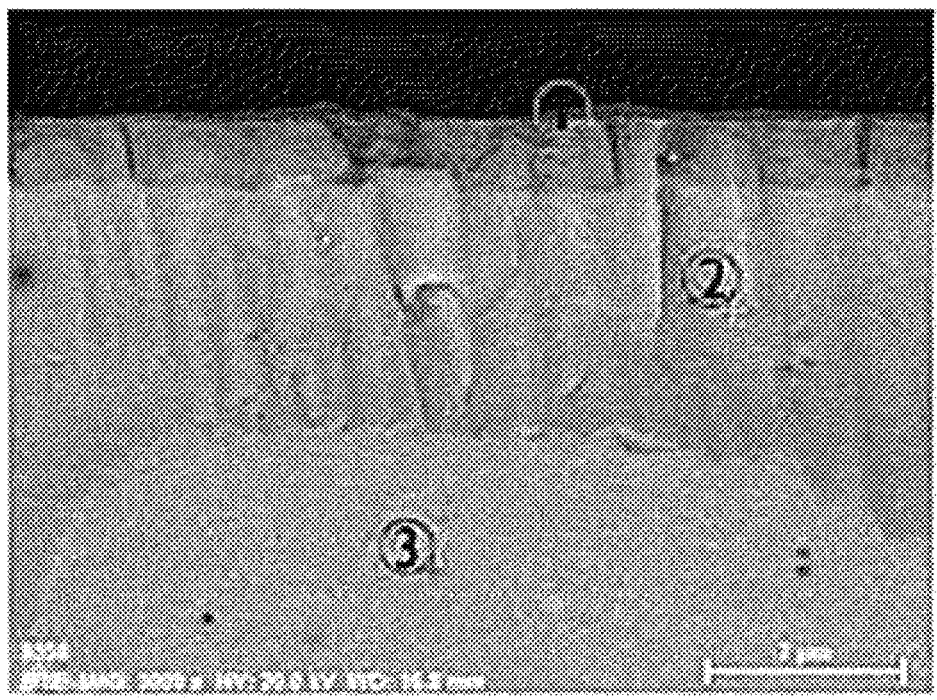

[Fig. 2B]
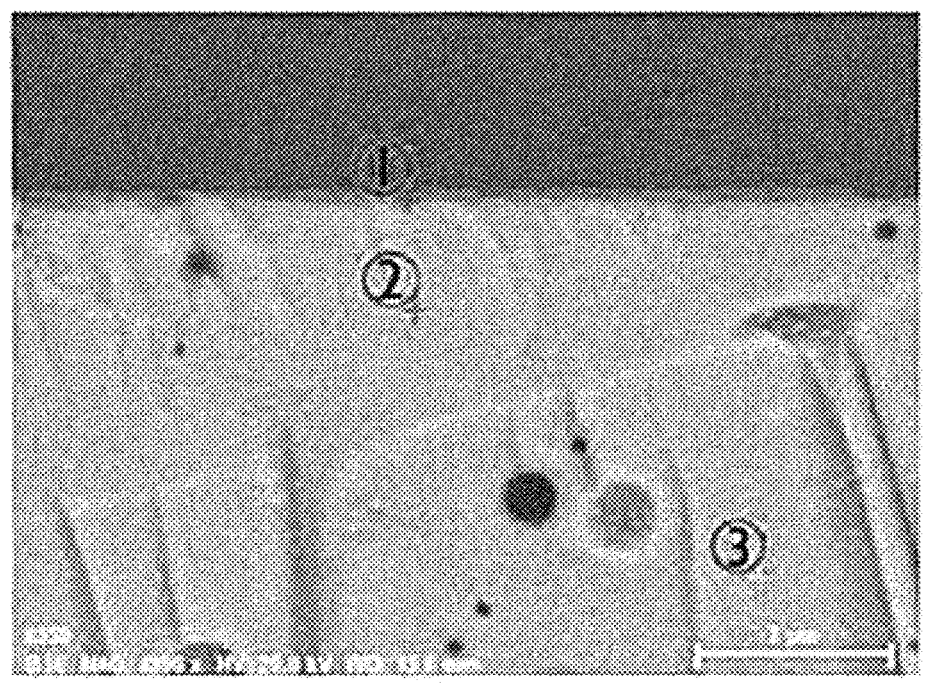

GLASS MATERIAL FOR SEALING LARGE-AREA DYE-SENSITIZED SOLAR CELL

DESCRIPTION OF GOVERNMENT FUNDED RESEARCH AND DEVELOPMENT

The research is conducted by support of Ministry of Trade, Industry and Energy Korea Industrial Complex Corp. (Production technology commercialization supporting project, the world's largest sized large-area (90×60 cm$^2$) dye-sensitized solar cell panel development, Project Serial Number: Gumi-R and D-2013-07) under the supervision of Orion Co., Ltd.

TECHNICAL FIELD

The present disclosure relates to a glass material for sealing a large-area dye-sensitized solar cell, and more particularly, to a glass material which does not react with an electrolyte and allows uniform and high-strength bonding over a large area.

BACKGROUND ART

Dye-sensitized solar cells said to be a next-generation solar cell is a semi-permanent solar cell developed by using a dye which is a polymer material to produce and absorb electrons, and recently, they are gaining attention as a new environmental renewable energy source. Dye-sensitized solar cells use a transparent glass substrate and can freely display colors according to the type of dye and thus have an aesthetic value, and can be made in different sizes, so they are expected to be easily used over a wide range of applications, and are of high use. However, because efficiency is still low at the current level of development, they are not fully used in all possible applications, and large-area dye-sensitized solar cells are produced on a trial basis and some are being used for interior applications on windows or walls. Accordingly, the potential for development of dye-sensitized solar cells is high, and in this instance, large-area fabrication of dye-sensitized solar cells is an important factor of development.

In addition to a dye, dye-sensitized solar cells use an electrolyte as an electron transport channel, and liquid electrolytes differ in components according to the type of dye. For electrolyte impregnation, a partition wall is needed to prevent an electrolyte from leaking, and DuPont™ Surlyn film which is a polymer material was used as a conventional sealing material for a dye-sensitized solar cell. However, Surlyn film has limitations in the respect that it has low mechanical durability, is difficult to achieve precise bonding because it is of film type, and is prone to react with oxygen or water due to the properties of organics. Particularly, for large-area fabrication, precise bonding and high mechanical durability for maintaining adhesion of a large-area substrate is required, but Surlyn film is difficult to satisfy these requirements.

To solve the problem, glass is used as a sealing material to ensure the mechanical durability and allow uniform bonding by a screen printing method using a glass paste. Furthermore, formulation free of alkali and transition metal is needed to minimize reactivity of glass with an electrolyte in order to ensure the chemical durability.

On the other hand, TiO$_2$ is used as an electron transport material of a dye-sensitized solar cell, but TiO$_2$ changes in crystal structure depending on the phase, and in this instance, in the case of phase having the greatest electron transport ability, a phase transition occurs at 550° C., and accordingly, there is a need for glass formulation that can be used at 550° C. or less.

There are results of studies using, as a sealing material, commercial glasses conventionally used, such as borosilicate or soda-lime, but high process temperature is required, and thus, glass production was difficult and uniform bonding was not easy. Furthermore, there were instances of using a laser to replace high process temperature, but precise laser control is difficult, so difficulty in uniform bonding still exists.

Moreover, commercial glass formulations include some alkali elements and transition metals, and this causes a problem as well.

DISCLOSURE

Technical Problem

The present disclosure is designed to solve the aforementioned problems, and therefore the present disclosure is directed to providing a glass composition for sealing a large-area dye-sensitized solar cell with high chemical stability and mechanical durability.

Technical Solution

To achieve the aforementioned object, the present disclosure provides a glass composition for sealing a dye-sensitized solar cell including $P_2O_5$—$V_2O_5$—$(Sb_2O_3+ZnO)$ based glass, wherein the $P_2O_5$ is present in 25 to 35 mol %, the $V_2O_5$ is present in 25 to 35 mol %, the $(Sb_2O_3+ZnO)$ is present in 20 to 35 mol %, and $ZnO/P_2O_5$ has a value ranging between 0.8 and 1.

The composition may further include 2 to 6 mol % of $Al_2O_3$.

The composition may further include at least one of $K_2O$, $MnO_2$, $TiO_2$, $CuO$, $SnO$, $BaO$, $SrO$, $TeO_2$, and $SiO_2$ in an amount higher than 0 mol % and less than or equal to 5 mol %.

The glass composition may have a glass transition temperature of from 300° C. to 400° C., and a firing temperature of from 400° C. to 500° C.

Furthermore, the present disclosure provides a paste for sealing a dye-sensitized solar cell including the glass composition, and an organic vehicle.

Advantageous Effects

According to the present disclosure hereinabove provided, effects are expected to uniformly seal dye-sensitized solar cells, ensure chemical stability due to non-reaction with an electrolyte, and provide a high mechanical strength suitable for large-area bonding, thereby increasing the reliability and lifetime of solar cell products.

Furthermore, glass for sealing a dye-sensitized solar cell according to the present disclosure has the same firing temperature as the firing temperature set when manufacturing unit cells of dye-sensitized solar cells, so there is no need to separately perform a sealing process, thereby simplifying the process, and building a mass production system is expected to be easy.

Furthermore, glass for sealing a dye-sensitized solar cell according to the present disclosure does not need any separate limitation on environment, leading to a wide of selections of process applications.

Furthermore, as glass can be fired at 500° C. or less, it is expected to produce the effects in preventing damage in an electrolyte and an electrode and deformation of a substrate that may occur when fabricating dye-sensitized solar cells at high temperature.

DESCRIPTION OF DRAWINGS

FIG. 1 is a phase diagram for a three-component system based on observations of a formation region of $P_2O_5$—$V_2O_5$—$(Sb_2O_3+ZnO)$ based glass.

FIG. 2A and FIG. 2B are scanning electron microscope (SEM) images after a reaction of a $P_2O_5$—$V_2O_5$—$(Sb_2O_3+ZnO)$ based glass material according to an embodiment of the present disclosure with an electrolyte.

BEST MODE

Hereinafter, the embodiments of the present disclosure are described in detail with reference to the accompanying drawings and diagrams. The embodiments disclosed below are provided for illustrative purposes to give a full understanding of the spirit of the present disclosure to those having ordinary skill in the technical field to which the present disclosure belongs. Therefore, the present disclosure is not limited to the disclosed embodiments and may be embodied in different form.

First, a glass composition for sealing a dye-sensitized solar cell according to an embodiment of the present disclosure is described in detail.

FIG. 1 shows a three-component system of $P_2O_5$—$V_2O_5$—$(Sb_2O_3+ZnO)$ based glass and a glass composition prepared by an embodiment of the present disclosure.

The glass composition for sealing a dye-sensitized solar cell includes $P_2O_5$—$V_2O_5$—$(Sb_2O_3+ZnO)$ based glass, and the $P_2O_5$—$V_2O_5$—$(Sb_2O_3+ZnO)$ based glass may include 20 to 60 mol % of $P_2O_5$, 20 to 60 mol % of $V_2O_5$, and 20 to 60 mol % of $(Sb_2O_3+ZnO)$. The glass composition for sealing a dye-sensitized solar cell having the above component ratio is not susceptible to crystallization and phase separation, and because it does not contain alkali elements and transition metals that react with an electrolyte, it is not reactive with an electrolyte, and thus, is chemically stable, and it is physically strong with high bonding strength, and can be fired at the same temperature as the firing temperature of the dye-sensitized solar cell, facilitating the process.

A main cause of high bonding strength is sufficient flowability possessed due to low temperature, and can be explained by the fact that additional components added in small amounts form a strong bond by ion exchange with a substrate.

Furthermore, a main cause of low firing temperature is the use of $V_2O_5$ and $P_2O_5$, and it is because a conventional three-component system corresponds to materials all involved in having low temperature, to be more specific, $V_2O_5$ and $P_2O_5$ form a glass network structure of weak bonds, and nevertheless, ensuring durability to some extent can be explained by the fact that $ZnO+Sb_2O_3$ acts to connect $V_2O_5$ to $P_2O_5$ between the two materials.

The firing temperature of the $P_2O_5$—$V_2O_5$—$(Sb_2O_3+ZnO)$ based glass may be 500° C. or less. This signifies that low firing is possible, which characterizes the present disclosure.

The $P_2O_5$ in the glass composition for sealing a dye-sensitized solar cell is one of glass network formers, and can form two-dimensional and three-dimensional basic structures in glass. Glass containing the $P_2O_5$ increases in flowability during a firing process, facilitating the process, but as the content increases, vulnerability to water increases and the chemical durability reduces, so it is necessary to control the component ratio.

Accordingly, the $P_2O_5$—$V_2O_5$—$(Sb_2O_3+ZnO)$ based glass according to an embodiment of the present disclosure may include 20 to 60 mol % of $P_2O_5$. When the $P_2O_5$—$V_2O_5$—$(Sb_2O_3+ZnO)$ based glass includes less than 20 mol % of $P_2O_5$, flowability reduces, making firing difficult, and when the $P_2O_5$—$V_2O_5$—$(Sb_2O_3+ZnO)$ based glass includes higher than 60 mol % of $P_2O_5$, wettability increases and the chemical durability reduces. Accordingly, $P_2O_5$ has its critical significance within the above numerical range.

On the other hand, the $V_2O_5$ in the glass composition for sealing a dye-sensitized solar cell may serve as a network modifier to break the network structure, but a large amount of $V_2O_5$ may form a glass structure with a certain amount of $P_2O_5$. Furthermore, the $V_2O_5$ acts to lower the firing temperature of glass, facilitating the firing, and reduce the thermal expansion coefficient. The $P_2O_5$—$V_2O_5$—$(Sb_2O_3+ZnO)$ based glass according to an embodiment of the present disclosure may include 20 to 60 mol % of $V_2O_5$. When the $P_2O_5$—$V_2O_5$—$(Sb_2O_3+ZnO)$ based glass includes less than 20 mol % of $V_2O_5$, wettability increases and the chemical durability of glass reduces due to relatively high fractions of $P_2O_5$, and when the $P_2O_5$—$V_2O_5$—$(Sb_2O_3+ZnO)$ based glass includes higher than 60 mol % of $V_2O_5$, the glass material to be produced will be physically weak or the firing temperature will be too low. Accordingly, $V_2O_5$ has its critical significance within the above numerical range.

The $(Sb_2O_3+ZnO)$ in the glass composition for sealing a dye-sensitized solar cell is used as a portion of a network modifier, and when the $(Sb_2O_3+ZnO)$ is present in small amounts, it serves as a network former of the $P_2O_5$—$V_2O_5$—$(Sb_2O_3+ZnO)$ based glass and increases the chemical and mechanical durability of glass, but as the content increases, the softening point increases and the viscosity increases, causing phase separation and crystallization of glass. The $P_2O_5$—$V_2O_5$—$(Sb_2O_3+ZnO)$ based glass according to an embodiment of the present disclosure may include 20 to 60 mol % of $(Sb_2O_3+ZnO)$. When the $P_2O_5$—$V_2O_5$—$(Sb_2O_3+ZnO)$ based glass includes less than 20 mol % of $(Sb_2O_3+ZnO)$, the mechanical and chemical stability of glass reduces, and chemically, a reaction with oxygen or air or an electrolyte occurs, and physically, the crosslinking role of $P_2O_5$ and $V_2O_5$ is weakened, causing a problem with durability, which makes it difficult to be used as a glass material, and in contrast, when the $P_2O_5$—$V_2O_5$—$(Sb_2O_3+ZnO)$ based glass includes higher than 60 mol % of $(Sb_2O_3+ZnO)$, disadvantages are that the viscosity of glass increases, leading to insufficient flowability at the temperature of 600° C. or less and making firing difficult, which cause phase separation and crystallization of the glass material. Accordingly, $(Sb_2O_3+ZnO)$ has its critical significance within the above numerical range.

Furthermore, the glass composition for sealing a dye-sensitized solar cell according to an embodiment of the present disclosure may further include 2 to 6 mol % of $Al_2O_3$. The $Al_2O_3$ performs the role of strengthening the glass structure and increasing the reactivity with an electrolyte. When less than 2 mol % of $Al_2O_3$ is present, its effect is insignificant, and when higher than 6 mol % of $Al_2O_3$ is present, crystallization of glass may occur. Accordingly, $Al_2O_3$ has its critical significance within the above numerical range.

In addition to the $P_2O_5$—$V_2O_5$—$(Sb_2O_3+ZnO)$ based glass, the glass composition for sealing a dye-sensitized solar cell according to an embodiment of the present disclosure may further include at least one of $K_2O$, $MnO_2$, $TiO_2$, CuO, SnO, BaO, SrO, $TeO_2$, and $SiO_2$ in an amount higher than 0 mol % and less than or equal to 5 mol %, and it may replace a portion of the ($Sb_2O_3$+ZnO).

The $K_2O$, $MnO_2$, $TiO_2$, CuO, SnO, BaO, SrO, $TeO_2$, and $SiO_2$ may strengthen or weaken the network structure in the $P_2O_5$—$V_2O_5$—($Sb_2O_3$+ZnO) based glass, increasing or decreasing the softening point, but may act to improve the adhesive strength and the chemical and mechanical stability. When higher than 5 mol % of the $K_2O$, $MnO_2$, $TiO_2$, CuO, SnO, BaO, SrO, $TeO_2$, and $SiO_2$ is present, as the structure of glass changes, the firing temperature may be increased or decreased according to the formulation, with a great range of the increases or decreases, or causing phase separation and crystallization.

The glass for sealing a dye-sensitized solar cell according to the present disclosure including the $K_2O$, $MnO_2$, $TiO_2$, CuO, SnO, BaO, SrO, $TeO_2$, and $SiO_2$ is described in detail as below.

On the other hand, the glass composition for sealing a dye-sensitized solar cell according to an embodiment of the present disclosure may fail to further include an additional transition metal such as Cr, Fe, Co, Ni, Mo or Bi. The transition metal reacts with an electrolyte in the dye-sensitized solar cell, causing release and precipitation, which may reduce the durability of the glass for sealing a dye-sensitized solar cell. However, the scope of the present disclosure is not limited thereto.

The sealing of the dye-sensitized solar cell bonds two substrates and the electrolyte used acts to block the contact with air, water and other contaminants. A conventional sealing material includes a synthesized polymer material, for example, Surlyn film, and the film achieves stable bonding and sealing in a single cell, but as areas become larger, the bonding strength is low and a process for uniform bonding is unfavorable, and a contact surface with oxygen or moisture increases and a reaction with an electrolyte increases, making it difficult to use.

Accordingly, the use of appropriate glass for sealing a large-area dye-sensitized solar cell as a sealing material can compensate for the poor mechanical durability that may occur when Surlyn film is used as above, and besides, ensure the chemical and thermal durability.

This glass composition can be used as a material for sealing a dye-sensitized solar cell, together with an organic vehicle.

Hereinafter, a glass manufacturing method according to another embodiment of the present disclosure is described in detail.

The glass manufacturing method according to another embodiment of the present disclosure includes mixing 20 to 60 mol % of $P_2O_5$, 20 to 60 mol % of $V_2O_5$, and 20 to 60 mol % of $Sb_2O_3$+ZnO with an organic vehicle and firing at a predetermined firing temperature. The firing includes, but not limited to, molding the glass and the vehicle by heating, and for example, may be performed by processes including a screen printing process, and besides the above method, the firing may be also performed by various methods. Subsequently, the molded glass and vehicle are heated at the predetermined firing temperature so they are melted by heating and molded, and then cooled to complete a sealing material.

As the glass does not include alkali elements and additional transition metals such as Cr, Fe, Co, Ni, Mo or Bi, a maximum of reactable factors of the glass with an electrolyte is obviated. Thereby release and precipitation reactions are impeded, ensuring high chemical and mechanical stability.

When the $K_2O$, $MnO_2$, $TiO_2$, CuO, SnO, BaO, SrO, $TeO_2$, and $SiO_2$ replace ($Sb_2O_3$+ZnO), the glass phase is stabilized, and it is possible to control the flowability at a predetermined temperature. Accordingly, as the $P_2O_5$—$V_2O_5$—($Sb_2O_3$+ZnO) based glass further includes the $K_2O$, $MnO_2$, $TiO_2$, CuO, SnO, BaO, SrO, $TeO_2$, and $SiO_2$, the process applicability can be improved.

Hereinafter, specific examples according to the present disclosure are described in detail with reference to the drawings.

Example $P_2O_5$—$V_2O_5$—($Sb_2O_3$+ZnO) based glass is weighted for each sample by the formulation as shown in the following Table 1. Although in particular, BaO is herein selected from $K_2O$, $MnO_2$, $TiO_2$, CuO, SnO, BaO, SrO, $TeO_2$, and $SiO_2$, other materials enumerated above can replace it within the range of formulations presented in the present disclosure.

TABLE 1

| | | | | | | | | | | |
|---|---|---|---|---|---|---|---|---|---|---|
| | Unit: mol % | | | | | | | | | |
| Glass sample | $P_2O_5$ | $V_2O_5$ | ZnO | $Sb_2O_3$ | $Al_2O_3$ | BaO | Melting results | Firing results | Note | ZnO/$P_2O_5$ |
| 1 | 31.5 | 30 | 31.5 | 5 | 2.0 | | ○ | ○ | crystallization | 1 |
| 2 | 31.5 | 30 | 31.5 | 4 | 3.0 | | ○ | X | crystallization | 1 |
| 3 | 31.5 | 30 | 31.5 | 4 | | 3.0 | ○ | X | | 1 |
| 4 | 31.5 | 30 | 31.5 | 2 | | 5.0 | ○ | ○ | | 1 |
| 5 | 31.5 | 30 | 31.5 | 0 | | 7.0 | ○ | ○ | crystallization | 1 |
| 6 | 31.5 | 30 | 33.5 | 0 | | 5.0 | ○ | X | crystallization | 1.06 |
| 7 | 31.5 | 30 | 31.0 | 2 | 0.5 | 5.0 | ○ | X | | 0.98 |
| 8 | 31.5 | 30 | 30.5 | 2 | 1.0 | 5.0 | ○ | ○ | | 0.97 |
| 9 | 31.5 | 30 | 29.5 | 2 | 2.0 | 5.0 | ○ | ○ | | 0.94 |
| 10 | 31.5 | 30 | 31.5 | 1 | 1.0 | 5.0 | ○ | ○ | | 1 |
| 11 | 31.5 | 30 | 31.5 | 0 | 2.0 | 5.0 | ○ | ○ | | 1 |
| 12 | 30.0 | 30 | 30 | 0 | 5.0 | 5.0 | ○ | Δ | | 1 |
| 13 | 29.0 | 30 | 29 | 0 | 7.0 | 5.0 | ○ | Δ | crystallization | 1 |

TABLE 1-continued

Unit: mol %

| Glass sample | $P_2O_5$ | $V_2O_5$ | ZnO | $Sb_2O_3$ | $Al_2O_3$ | BaO | Melting results | Firing results | Note | $ZnO/P_2O_5$ |
|---|---|---|---|---|---|---|---|---|---|---|
| 14 | 27.5 | 30 | 27.5 | 0 | 10.0 | 5.0 | ○ | ○ | firing X | 1 |
| 15 | 29.5 | 30 | 31.5 | 0 | 4.0 | 5.0 | ○ | Δ | | 1.06 |
| 16 | 31.5 | 30 | 29.5 | 0 | 4.0 | 5.0 | ○ | Δ | | 0.94 |
| 17 | 31.5 | 28 | 31.5 | 0 | 4.0 | 5.0 | ○ | Δ | | 1 |
| 18 | 31.5 | 30 | 28.5 | 0 | 5.0 | 5.0 | ○ | ○ | | 0.90 |
| 19 | 31.5 | 30 | 27.5 | 0 | 4.0 | 7.0 | ○ | ○ | | 0.87 |
| 20 | 31.5 | 30 | 26.5 | 0 | 5.0 | 7.0 | ○ | ○ | | 0.84 |
| 21 | 31.5 | 30 | 24.5 | 0 | 7.0 | 7.0 | ○ | X | firing X | 0.78 |
| 22 | 31.5 | 30 | 21.5 | 0 | 7.0 | 10.0 | ○ | X | crystallization | 0.68 |
| 23 | 31.5 | 30 | 21.5 | 0 | 10.0 | 7.0 | X | — | phase separation | 0.68 |
| 24 | 31.5 | 30 | 18.5 | 0 | 10.0 | 10.0 | X | — | phase separation | 0.59 |
| 25 | 31.5 | 30 | 27.5 | 0 | 6.0 | 5.0 | ○ | ○ | | 0.87 |
| 26 | 31.5 | 30 | 25.5 | 0 | 8.0 | 5.0 | ○ | Δ | | 0.81 |

(Melting results: ○-excellent, Δ-moderate, X-crystallized or unmelted)
(Firing results: ○-excellent, Δ-moderate, X-crystallized or unflowable)

The glass sample Nos. 1 to 26 were melted for 30 minutes by heating in air at 1100° C. using an electric furnace, and then quenched to manufacture glass. As a result, as shown in Table 1, all the glass samples except Nos. 23 and 24 among the glass samples including $P_2O_5$, $V_2O_5$, and ($Sb_2O_3$+ZnO) were melted.

Subsequently, each of the sample Nos. 1 to 26 was processed into powder of 50 μm or less to prepare glass powder, which was heated at 500° C. and fired for 30 minutes. As a result, as shown in Table 1, the case of including 25 to 35 mol % of $P_2O_5$, 25 to 35 mol % of $V_2O_5$, and 20 to 35 mol % of $Sb_2O_3$+ZnO, the case of including 5 mol % or less of BaO, and the case of including 2 to 6 mol % of $Al_2O_3$ all showed excellent firing results.

Along with this, according to this embodiment, the glass composition having a mole ratio of $ZnO/P_2O_5$ higher than 0.8 and less than or equal to 1 showed excellent firing results.

The excellent firing result refers to no crystallization, good melting, and smooth processing by firing.

On the other hand, FIG. 2A and FIG. 2B are SEM images captured after a reaction of the $P_2O_5$—$V_2O_5$—($Sb_2O_3$+ZnO) based glass material by an embodiment of the present disclosure with an electrolyte, and after Nos. 4 and 11 samples showing excellent results in the above Table 1 were impregnated with an electrolyte of the temperature of 60° C. for 72 hours, a cross section was observed to determine the degree of reactivity. FIG. 2A is about No. 4, and FIG. 2B is about No. 11.

In the case of a conventional glass composition, after its reaction with an electrolyte, crystallization on its surface and reaction showed a very sever tendency, while an embodiment of the present disclosure, Nos. 4 and 11, did not have severe crystallization and much damage caused by a reaction with an electrolyte as opposed to the convention glass formulation, and rather, as can be seen from the cross-sectional photographic image, when compared to No. 4 in which layers were separated by a reaction with an electrolyte, No. 11 having the added $Al_2O_3$ showed no layer separation, so it could be seen that the case of No. 11 had relatively lower reactivity to an electrolyte and exhibited very good results.

Based on the above results, as a result of making a dye-sensitized solar cell using an embodiment of the present disclosure, Nos. 4 and 11 compositions, it was found that crystal growth at the interface between an electrolyte and a sealing material occurred in convention glass and its resulting severe efficiency reduction did not occur.

The description hereinabove provided has described the technical spirit of the present disclosure for illustrative purposes only, and various modifications, changes and substitutions can be made by those skilled in the art without departing from the nature of the present disclosure. Accordingly, the embodiments disclosed herein are provided to describe, but not intended to limit the technical spirit of the present disclosure, and the scope of the technical spirit of the present disclosure is not limited by these embodiments. The scope of protection of the present disclosure should be interpreted by the appended claims, and the full technical spirit within the scope in equivalence thereto shall be interpreted as being included in the scope of protection of the present disclosure.

The invention claimed is:

1. A glass composition for sealing a dye-sensitized solar cell, the glass composition comprising:
    $P_2O_5$—$V_2O_5$—($Sb_2O_3$+ZnO) based glass, wherein the $P_2O_5$ is present in 25 to 35 mol %, the $V_2O_5$ is present in 25 to 35 mol %, the ($Sb_2O_3$+ZnO) is present in 20 to 35 mol %, and a ratio of $ZnO/P_2O_5$ has a value ranging between 0.8 and 1,
    wherein the composition further comprising $Al_2O_3$, BaO and $TeO_2$, wherein $Al_2O_3$ is present at 2 to 6 mol %, BaO is present in 5 mol % or less, and $TeO_2$ is present in 5 mol % or less,
    and wherein the composition comprises no alkali metal oxides or any element selected from the group consisting of Cr, Fe, Co, Ni, Mo and Bi.

2. The glass composition for sealing a dye-sensitized solar cell according to claim 1, further comprising:
    at least one of $MnO_2$, $TiO_2$, CuO, SnO, SrO, and $SiO_2$ in an amount higher than 0 mol % and less than or equal to 5 mol %.

3. The glass composition for sealing a dye-sensitized solar cell according to claim 1, wherein the glass composition has a glass transition temperature of from 300° C. to 400° C., and a firing temperature of from 400° C. to 500° C.

4. A paste for sealing a dye-sensitized solar cell, the paste comprising:

a glass composition $P_2O_5$—$V_2O_5$—($Sb_2O_3$+ZnO) based glass, wherein the $P_2O_5$ is present in 25 to 35 mol %, the $V_2O_5$ is present in 25 to 35 mol %, the ($Sb_2O_3$+ZnO) is present in 20 to 35 mol %, and a ratio of ZnO/$P_2O_5$ has a value ranging between 0.8 and 1, wherein the composition further comprising $Al_2O_3$, BaO and $TeO_2$, wherein $Al_2O_3$ is present at 2 to 6 mol %, BaO is present in 5 mol % or less, and $TeO_2$ is present in 5 mol % or less; and an organic vehicle, and wherein the composition comprises no alkali metal oxides or any element selected from the group consisting of Cr, Fe, Co, Ni, Mo and Bi.

5. The paste according to claim 4, wherein the glass composition further comprises at least one of $MnO_2$, $TiO_2$, CuO, SnO, SrO, and $SiO_2$ in an amount higher than 0 mol % and less than or equal to 5 mol %.

6. The paste according to claim 4 wherein the glass composition has a glass transition temperature of from 300° C. to 400° C., and a firing temperature of from 400° C. to 500° C.

* * * * *